United States Patent [19]

Burton et al.

[11] Patent Number: 4,505,035

[45] Date of Patent: Mar. 19, 1985

[54] METHODS OF ALIGNING AND MOUNTING A PLURALITY OF ELECTRICAL LEADS TO A PLURALITY OF TERMINALS

[75] Inventors: William H. Burton, Lee's Summit; William E. Snow, Grandview, both of Mo.

[73] Assignees: AT&T Technologies, Inc.; Bell Telephone Laboratories, Inc., both of New York, N.Y.

[21] Appl. No.: 483,991

[22] Filed: Apr. 11, 1983

[51] Int. Cl.³ .............................................. H05K 3/00
[52] U.S. Cl. ........................................ 29/843; 29/840; 228/255; 228/180.2
[58] Field of Search ............... 228/56 R, 255, 180 A; 339/17 CF; 29/827, 843, 860

[56] References Cited

U.S. PATENT DOCUMENTS

| | | | |
|---|---|---|---|
| 1,399,769 | 12/1921 | Hodgkinson | 228/56 R |
| 3,184,699 | 5/1965 | Spera | 339/17 CF |
| 3,657,789 | 4/1972 | Anglade | 228/255 X |
| 3,750,252 | 8/1973 | Landman | 228/180 A X |
| 3,750,265 | 8/1973 | Cushman | |
| 3,886,650 | 6/1975 | Cobaugh et al. | |
| 3,913,818 | 10/1975 | Osipov et al. | 228/255 X |
| 4,396,140 | 8/1983 | Jaffe et al. | 228/180 A X |
| 4,399,610 | 8/1983 | Moyer | 29/827 |

OTHER PUBLICATIONS

Western Electric Tech Digest, No. 62, Apr. 1981, p. 9, Connectors and Printed Wiring Boards by D. T. L. Pari et al.

Primary Examiner—Howard N. Goldberg
Assistant Examiner—Carl J. Arbes
Attorney, Agent, or Firm—W. O. Schellin

[57] ABSTRACT

A circuit board connector (14) is assembled to a printed wiring board (11) by first aligning a plurality of leads (18) by urging them into spaced guide grooves (49) of a workholder (41). The spacing of the guide grooves (49) corresponds to the spacing of terminals, also referred to as solder lands (19) on the printed wiring board (11). Within the guide grooves (49) the leads (18) are retained against a possible, lateral resilient stress while a deformable material, such as a solder, is formed across the leads and into spaces between the leads (18). The solder temporarily retains the spacing between the leads while the leads are removed from the workholder and become aligned with the lands (19). During the assembly of the connector (14) to the printed wiring board (11), the leads become resiliently deflected perpendicularly to the plane of the printed wiring board (11). The deflection generates a resilient force which frictionally urges the leads and the lands into contact with each other. The friction contact maintains the aligned position of the leads against any remaining lateral stresses within the leads (18) while the spacing solder is melted, reflows and solidifies to permanently bond the aligned leads (18) to the lands (19).

7 Claims, 7 Drawing Figures

METHODS OF ALIGNING AND MOUNTING A PLURALITY OF ELECTRICAL LEADS TO A PLURALITY OF TERMINALS

FIELD OF THE INVENTION

The present invention relates to methods of and a workholder for aligning and mounting a plurality of leads to a corresponding plurality of spaced terminals. The invention relates particularly to methods of and to a workholder for aligning leads to the spacing of terminals of a printed wiring board. A typical example of an assembly process and of a product to which the invention advantageously applies, is the assembly of a circuit pack connector to the edge of a printed wiring board. Various features and advantages of the invention are described with respect to the assembly of such a connector.

BACKGROUND OF THE INVENTION

Emphasis in the electrical equipment manufacturing industry on the development of increasingly compact and complex electrical devices has resulted in the development of circuit board edge connectors which feature multiple-row lead-out connections. Instead of mechanically plugging a circuit board into an edge connector, whereby contact lands on each side of the circuit board are contacted by corresponding connector elements, closely spaced leads of a connector are soldered to corresponding lands on the circuit board, and the connector becomes permanently mounted to the circuit board.

A particular type of circuit pack connector, which becomes mounted through such a soldering operation to the edge of a circuit board, features an array of a plurality of rows of connector sockets. The respective circuit board may then be plug-connected to a corresponding array of pins extending from a connector plane. For example, circuit boards which feature such a circuit pack connector may be plugged into pins extending from the plane of a relatively larger main circuit board. Such plug-in assemblies of a plurality of sub-circuits to a main circuit permit dense packing of electronic circuit elements and a quick replacement of defective circuit portions.

A problem in the assembly of the referred to circuit pack type of connector results from the relatively close spacing of connector leads which need to be aligned with and soldered to equally narrow and closely spaced solder terminals at the edge of the respective circuit board. Close spacing of the leads in comparison to typical connector contact spacings comes about because of the rearraying of contact leads from an array of four or six rows into two rows of leads which are then solder-mounted to respective terminals on opposite sides of the circuit board. The problem is one of aligning the plurality of leads to their precise spacing.

A prior art alignment technique involves viewing the connector under a microscope and, with the help of a fine adjustment tool, manually bending into alignment any of the leads which are out of position.

SUMMARY OF THE INVENTION

In accordance with the invention, leads are aligned and assembled by guidedly moving the leads into predetermined spaced positions. A deformable material, such as solder, is then formed between and across each of the leads to retain established spaces between the leads. The leads are then resiliently deflected in a direction perpendicular to the plane of the leads and positioned adjacent to contact pads. The material having retained the spaces of the leads up to this point in the process is removed from between the leads, such as by melting, while the leads remain retained in position through friction resulting from a resilient contact force between the leads and the respective contact pads. In a specific, described embodiment, the solder conglomerates about the leads and resolidifies after melting to permanently bond the leads to the contact pads.

In accordance with another feature of the invention, a workholder has a plurality of spaced lead-guide grooves for receiving one of the leads in each such groove. A cross groove extends across each of such lead-guide grooves. The cross groove has a base depth which extends below the depth of the lead-guide grooves, and a pedestal is located within the confines of each of the intersections between the lead-guide grooves and the cross groove, such pedestal extending upward from the base depth of the cross groove to the depth of the lead-guide groove.

BRIEF DESCRIPTION OF THE DRAWING

Various features and advantages of the invention are best understood when the following detailed description is read in reference to the appended drawing, wherein.

DETAILED DESCRIPTION

1. The Product

Figure 1:
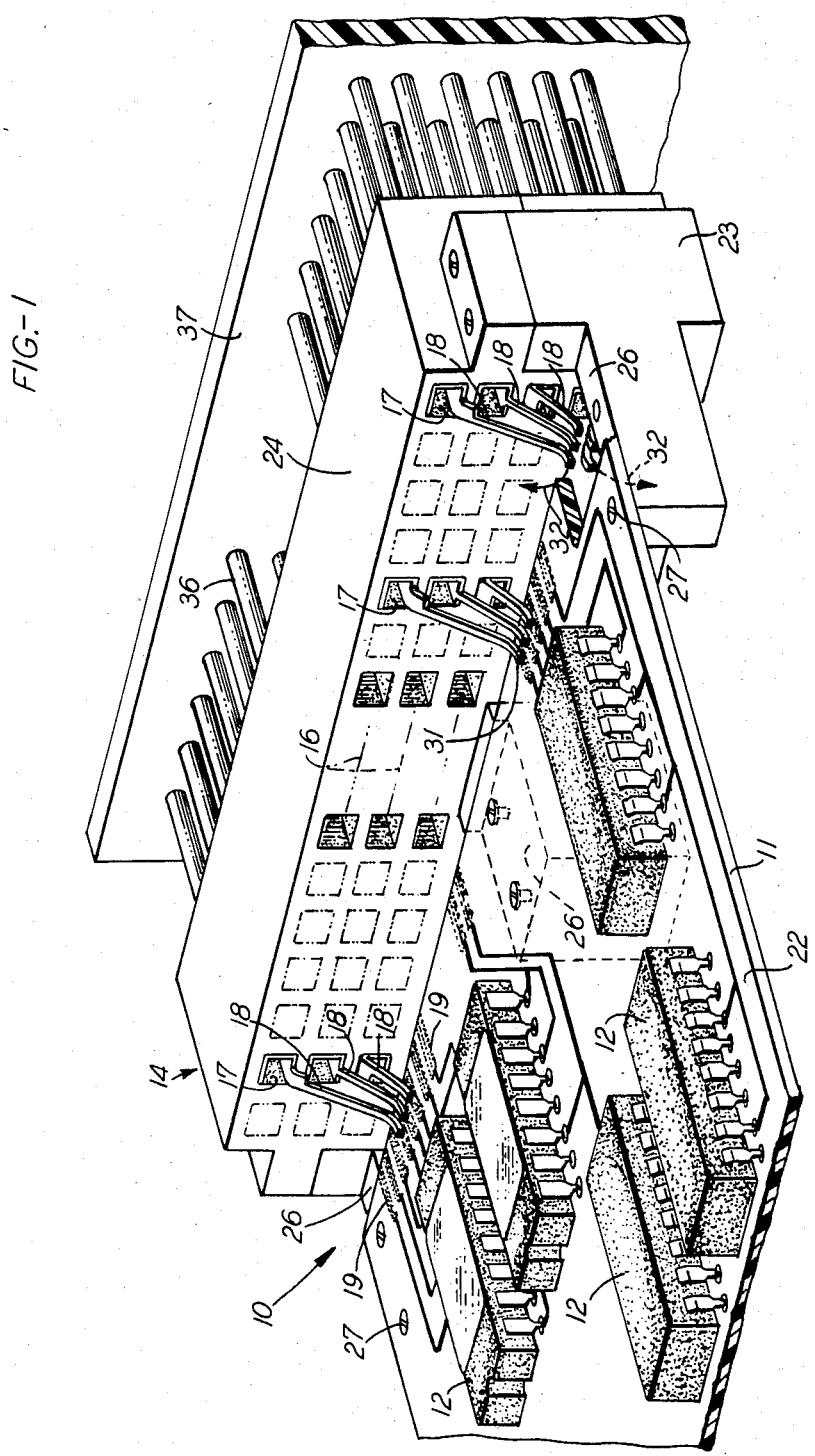
FIG. 1 is a perspective representation of an edge connector assembled to a circuit board.

Referring to FIG. 1, there is shown a circuit board assembly, designated generally by the numeral 10, which includes a typical, two-sided circuit board, also referred to as printed wiring board 11, which, in the preferred embodiment, supports a plurality of integrated circuit packs 12. Because of the complexity of the electrical circuit functions which are typically executed by the circuit packs 12, a large number of signal output lines from the circuit board assembly 10 to another part of an overall circuit are typically desirable. The printed wiring board 11 is therefore mounted to an edge connector which in the art is referred to as a circuit pack connector 14.

As shown in FIG. 1, the circuit pack connector 14 features a plurality of rows 16 of terminal sockets 17, and from each socket 17 a lead 18 establishes contact with one of a plurality of conductive solder pads referred to as lands 19 on the printed wiring board 11. The connector 14, which is shown, of course, as an example of one of a number of typical connectors to which the invention applies, is assembled of two connector halves 23 and 24. The lower connector half 23, as is best seen through the broken away portion of the printed wiring board 11, has a practical number of mounting ears 26. In the preferred embodiment there are three such ears 26. The printed wiring board 11 may be mounted, as for example by small screws 27, to such lower connector half 23. The upper connector half 24 is mounted to and supported by the lower half 23 of the connector 14.

The leads 18 of the two halves 23 and 24 are bent toward the printed wiring board 11 such that solder ends 31 of the leads 18 would be located, when in a relaxed position, in a plane beneath the respective major surface 22 of the printed wiring board 11. Thus, during the assembly of the connector halves 23 and 24 and the printed wiring board 11, the leads 18 are deflected resiliently, upward or downward, as the case may be, as indicated in FIG. 1 by the respective arrows 32. The solder ends 31 of the leads 18, even before they become soldered to their respective lands 19 are consequently resiliently biased against the lands 19.

FIG. 1 further shows the circuit board assembly 10 in alignment with an array of pins 36 which extend perpendicularly from the plane of a connector board 37. The connector board may be the main board of a major electrical device or a wiring board or frame to which the pins 36 are mounted in any of a number of ways.

2. The Workholder

Figure 2:
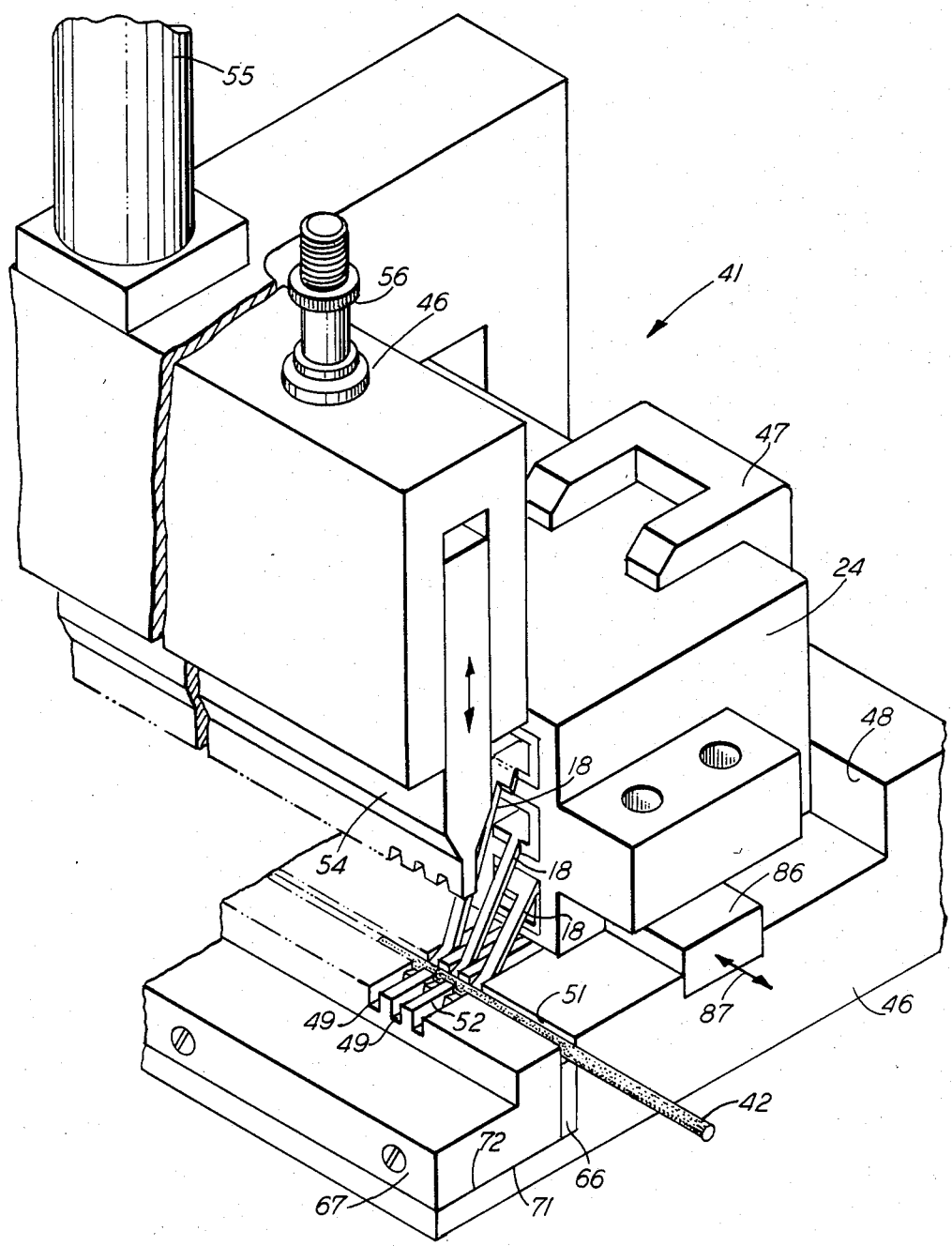
FIG. 2 shows a simplified view of a workholder and assembly tool, highlighting features of the invention as applied to the connector of FIG. 1 and its assembly to the circuit board as shown in FIG. 1.

Referring now to FIG. 2, there is shown an enlarged and partial view of a workholder 41 used in the assembly of the circuit board assembly 10 as seen in FIG. 1 and particularly in the preparation of the connector halves 23 and 24 to prepare them to be mounted to the circuit board 11 as in FIG. 1. FIG. 2 shows an end portion of a representative connector half, as, for example the upper connector half 24. The workholder 41, as will be seen from the following description, holds the connector half, provides a guiding restraint for each of the leads 18 which extend from the connector half, guides a linking, deformable mounting material with respect to the leads, and forms the mounting material, in the present example a solder wire 42, about and between the leads 18.

The workholder 41, consequently, has a base 46, which supports the connector half 24. The connector half 24 is temporarily mounted or clamped to the base 46 by a hold-down jaw or clamp 47. Preferably, the clamp 47 exerts a resilient clamping force against the connector half to avoid a sharply increasing force during the clamping operation which may damage the connector.

Before becoming clamped, the connector half 24 is located against a backstop 48 and is positioned in the longitudinal direction of the connector to align desired nominal positions of such leads with a plurality of parallel guide grooves 49 in the base 46. The grooves 49 are spaced by the same nominal distances that the lands 19 on the circuit board 11 are spaced. Thus, when the connector half 24 is placed on the base 46, most of the leads 18 extending from the connector half readily assume the proper position in a respective one of the grooves 49. However, because of the large number of leads associated with the connector half, a few leads tend to be bent and tend to rest on ridges adjacent to their grooves 49. A slight brushing across the grooves 49 in a back and forth motion perpendicularly to the length of the grooves 49 typically causes all of the leads to enter their respective grooves.

A cross groove 51 is formed at a right angle across end portions 52 of the guide grooves 49. The cross groove 51 is a guide track for the solder wire 42 and a mold to the shape of which the solder wire becomes formed by a ram 54. The ram 54 is reciprocatably mounted above the cross groove 51. A typical punch and die type mechanism, such as a hydraulic activator 55, may be used for driving the ram 54. Also, because of the desired action of forming the solder wire 42 to a particular contour, a positive stop against the downward movement of the ram is desirable, such as a ledge 56 which comes to bear against the base 46.

3. The Alignment Process

In the assembly of the connector 14 to the printed wiring board 11, a correct spacing of the leads 18 with respect to each other within relatively close tolerances is important. Heretofore, the leads 18 were checked by an operator with the help of an inspection tool such as, for example, an optical comparator. With the help of a projected, magnified image of the leads 18, the position of the leads 18 is compared against a preprinted standard image of the leads 18 in standard, normal positions. The preprinted image of the leads includes allowances in the outlines of the leads 18 for acceptable variations from an absolute norm. If the positions of the leads 18 are seen to fall outside of such acceptable variations, the operator adjusts the leads 18 with a hand tool to a position within acceptable limits.

The present assembly of the connector 14 eliminates, except for an adjustment of mechanically severely distorted leads, a manual checking and adjustment of the leads 18 prior to assembling the connector 14 to the printed wiring board 11. Mechanically severely distorted leads are occasionally found when one of the connector halves 23 or 24, after forming of the leads 18, is physically abused by being pushed or brushed against an abutment or edge of a handling tray, such that the leads 18 become severely dislocated from their desired positions.

Placing a respective connector half 24 into position on the workholder 41 permits a quick inspection of whether any leads of the connector half are in fact severely distorted. If they are distorted, the leads will not take up a position in their respective guide groove 49, such that at least one of the grooves 49 remains without a lead 18, a condition which is quickly recognized.

Typically, however, most of the leads 18 are within tolerance of their desired positions and either become located within the guide grooves 49 when the connector half becomes positioned on the base, or they rest on the base 46 adjacent to their respective grooves 49. Such remaining, non-seated leads 18 are brushed by an operator moving a typical bristle brush or any similarly suitable tool in a back and forth motion perpendicularly to the length of the grooves 49 to seat them into the guide grooves 49.

Figure 3:
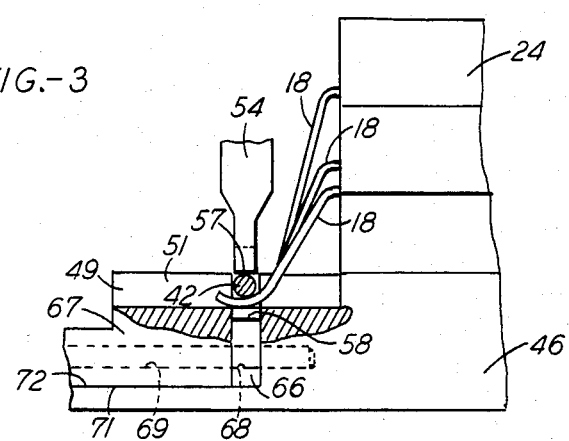
FIG. 3 shows portions of the workholder of FIG. 2 in greater detail.

The alignment and assembly of the leads 18 is best described in reference to FIGS. 3 through 7. FIG. 3 is a sectional view through a portion of the workholder 41. A lead 18 is located in its respective guide groove 49. The solder wire 42, shown in cross section, is located in the upper portion of the cross groove 51, and a lower surface 57 of the ram 54 has been moved into contact with the solder wire 42. Further downward movement of the ram 54 toward the solder wire and the lead 18 forms the solder wire 42 between contoured surfaces of the cross groove 51 and the ram 54.

Figure 4:
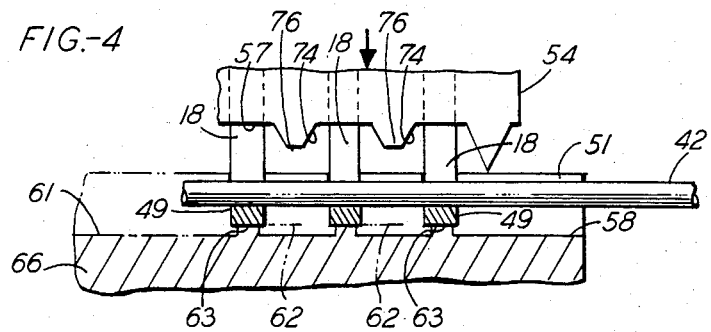
FIGS. 4–7 show a process sequence whereby the leads of a connector become spaced in accordance with the spacing of contact pads on a circuit board and then become attached to such contact pads as shown in FIG. 1.

Effective contoured surfaces which shape the solder wire as a result of the downward movement of the ram 54 are best shown in the sectional view along the cross groove 51 of FIG. 4. A plurality of the leads 18 are shown in position in their respective guide grooves 49. A contour of the cross groove 51 shows an alternatingly high and low level of a patterned bottom surface 58. A low level 61 of the surface 58 lies below the bottom of the guide grooves 49. However, a preferred difference in the depths of the two grooves 49 and 51 is slight. In the described embodiment the maximum depth of the cross groove 51 lies preferably 0.075 mm below the level of the guide grooves 49 and, thus, by the same distance below the leads 18 located in the guide grooves 49. In comparison, the lands 19 on the printed wiring board have a thickness of approximately 0.05 mm.

At each of the intersections of the cross groove 51 and the guide grooves 49 the bottom surface of the cross groove rises to a second higher level 62 which is the same as the level of the bottom of the guide grooves 49. Thus, in FIG. 4, the contour of the bottom of the cross groove 51 shows a plurality of evenly spaced pedestals 63 each of which supports one of the leads 18 within the region of the intersection of the cross groove 51 and the respective guide groove 49.

Referring back to FIG. 3, such a complex contour of the bottom surface of the cross groove 51 is readily achieved by forming the groove 51 in the base 46 as a composite structure of several structural elements. Thus, the upper surface of a spacer bar 66 having the width of the cross groove 51 forms the bottom surface 58 of the cross groove. An end cap 67 is then securely fastened into the base 46 to clamp the spacer bar 66 securely between the base 46 and the end cap 67.

According to one procedure for forming the grooves, the spacer bar is advantageously machined as a separate piece part to form the first, low level of the cross groove 51 as a plurality of machined cuts extending perpendicularly to the length of the spacer bar. The tops of the pedestals 63 advantageously remain at the time of the machining of the cut at a level higher than the second level 62 with respect to mounting holes 68. A block of material which ultimately becomes the end cap 67 has mounting holes 69 and machined reference surfaces, such as a lower mounting surface 71 which rests on a support surface 72 of the base 46. The block is mounted to the base 46, and the guide grooves 49 are milled into the base 46 and the block to form the finished end cap 67. The milling operation also establishes the second level 62 of the groove 51, namely the top of the pedestals 63, at precisely the same level as the depth of the guide grooves 49.

Figure 5:
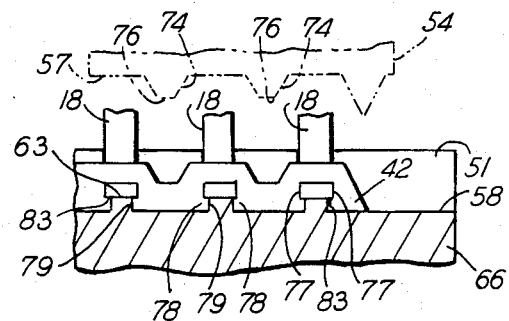

Referring now to FIG. 5, the sectional view thereof shows the solder wire 42 after it has been formed to the desired shape by the downward stroke of the ram 54, and the ram is again in its upward movement. The toothed contour of the lower surface 57 of the ram 54 has formed the solder wire 42 to the low level of the contour of the cross groove 51 between each of the leads 18. Also, cutouts in the surface 57 of the ram 54 have shaped the solder over the top of the leads 18. Sloped, chamfered surfaces 74 of the spaced forming teeth 76 of the ram 54 have urged the solder against side surfaces 77 of the leads 18, also forming retaining ledges 78 below the leads.

Figure 6:
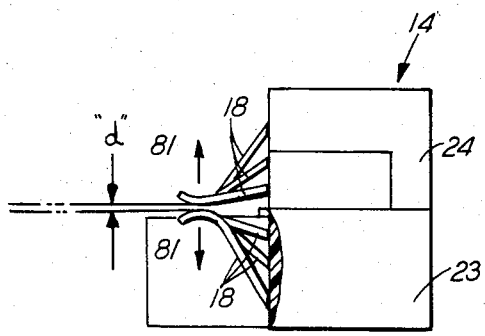

Thus, as shown in FIG. 5, an inverted channel 79 is formed beneath each lead 18. The channels 79 become advantageous in the assembly of the connector halves 23 and 24 to the printed wiring board 11, in that corresponding lands 19 on the board 11 fit into the channels 79, thereby guiding and locating the leads 18 with respect to the corresponding lands 19. FIG. 6 shows an end view of the connector halves 23 and 24 as they are assembled. A typical, nominal spacing "d" between the upper and lower rows 16 of the leads 18 is, for example, 0.75 mm. To mount the connector 14 to the printed wiring board 11, the connector halves 23 and 24 are loosened, and the two halves are separated as indicated by the arrows 81 in FIG. 6.

Figure 7:
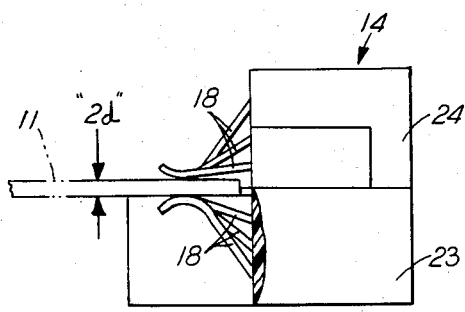

As shown in FIG. 7, the printed wiring board is then mounted to the connector half 23, and the connector halves 23 and 24 are mounted to each other. Mounting the connector halves 23 and 24 to the printed wiring board spreads the rows 16 to a gap width "2d", which is, in the preferred embodiment, approximately twice that of the original gap width or about 1.5 mm.

It is to be noted that during the assembly of the printed wiring board 11 to the connector halves 23 and 24, the lateral spacing between the leads 18, as it became established by the guide grooves 49, is retained by the formed solder wire 42. It has been found that typical contact copper alloy from which the leads 18 are formed are moved to the new "2d" spacing in a substantially resilient bending operation. To the extent that the leads 18 undergo plastic deformation in the vertical bending operation, it appears that a plastic set also affects resiliency or memory in the lateral direction, such that memory of a former laterally displaced position of any particular lead 18 is also diminished. However, to the extent that the leads 18 are resiliently spread from their original spacing, a vertical bias force is now exerted by the leads 18 against the respective lands 19.

The mechanical assemblage of the printed wiring board 11 and the connector 14 is heated to reflow the solder. As the solder liquefies, the solder breaks into physically and electrically separate nodules about each lead and conglomerates about the leads and the lands 19. Consequently, the leads lose the lateral support from the formed solder wire 42 between adjacent leads 18. However, the resilient urging force by the leads 18 against the lands 19 results in a friction contact force between each of the leads 18 and their respective lands 19. The friction force restrains the leads 19 from returning from their aligned positions to any former, unaligned positions.

Also, to the extent that the leads 18 become stress relieved during the heating operation to melt the solder, such stress relief partially relaxing the vertical friction force, a comparable lateral urging force to return the leads 18 to their original, unaligned positions will then also become relaxed. The amount of such stress relief of the leads 18 during the solder operation depends, of course, on the type of material of the leads. Thus, even though some stress relief may typically occur in the leads, the leads 18 are not apt to move from the lands 19 because of a relaxation of an existing friction force between the leads 18 and the lands 19.

4. Alternate Embodiments

The above-described features of the invention may be modified in a number of ways without departing from the spirit and scope of the invention. For example, the particular shape of the cross groove 51 in the workholder 41 for forming the solder wire 42 between and over the top of the leads 18 may be altered without the formed solder wire losing its capacity to space and retain the leads 18. The contour of the bottom of the cross groove 51 forming pedestals 63 in each of the intersections with one of the guide grooves presently permits the solder wire 42 to be formed around the side surfaces 77 of the leads 18 and into contact with lower surfaces 83 of the leads 18.

The advantage of forming the solder wire past the side surfaces 77 of the leads and into contact with such lower surfaces 83 has been found to cause the solder to flow readily in between the leads 18 and the corresponding lands 19 during the reflow operation. It should be understood that forming the solder wire 42 into contact with the lower surfaces 83 of the leads 18 has been found to be particularly advantageous. However, the advantage of the workholder 41, to align the leads 18 to a precise spacing without overforming, and to temporarily hold the leads at such spacing, even though the leads retain a low residual resilient stress, does not depend on the solder contacting such lower surfaces 83.

Also, because of the presence of the solder wire 42 temporarily spacing the leads 18, the alignment of the leads to the desired spacing in accordance with the spacing of the guide grooves 49 does not require a typical lead straightening operation wherein the leads are bent from an unaligned position past an aligned position to flex back into such aligned position. However, it is considered to be within the scope of the invention, for example, to adjust all of the leads 18 simultaneously by shifting the position of the connector 14 relative to the leads 18. Shifting can be accomplished through a movement, in reference to FIG. 2, of end locator blocks 86 and thereby of the connector 14 relative to the leads 18 held by the guide grooves 49 in the longitudinal directions of the connector, as indicated by arrow 87.

Inasmuch as the invention has been described with respect to mounting connector leads 18 by means of a solder connection and, therefore, using a solder wire form as a temporary spacer, it should be realized that if such leads are to be thermo-compression bonded to a substrate, a thermally degradable, such as, for example, through melting or vaporization, substance other than solder may be employed in lieu of the solder wire 42. Thermally decomposible plastics typically have the advantage of being electrical insulators, thus to the extent that a plastic remains on the surface of the substrate after bonding, the leads 18, or similar leads, will not become shorted to each other.

Furthermore, any dimensions or particular configurations of the leads, the lead deflection and the connector configuration are set forth for illustrative purposes only, any of such parameters may also differ or become modified without departure from the spirit and scope of the invention.

What is claimed is:

1. A method of aligning and assembling a plurality of electrical leads to a plurality of terminals spaced at predetermined intervals on a circuit substrate, which comprises:
    moving the leads into parallel guide grooves spaced in positions corresponding to such predetermined intervals;
    holding the leads in such spaced positions in said guide grooves while forming a spacing material over each of the leads and into spaces between adjacent ones of the leads, such that the spacing material in the spaces between the leads is formed to a level below the leads;
    assembling the spaced leads to said correspondingly spaced terminals by urging the leads into contact with the terminals to cause the leads to resiliently bear against the corresponding terminals, whereby the spacing material laterally guides each of the leads into positions in alignment with the terminals;
    removing the spacing material from the spaces between the leads after assembling the spaced leads to the correspondingly spaced terminals, whereby friction between the leads and the terminals retains the spacing of the leads; and
    bonding the leads to the respective terminals.

2. A method of aligning and assembling a plurality of electrical leads according to claim 1, wherein forming a spacing material comprises forming solder over each of the leads and into spaces between adjacent ones of the leads, and wherein removing the spacing material comprises heating the solder to melt the solder and allow the solder to flow from such spaces to the leads and terminals, and wherein bonding comprises allowing the solder to solidify while the leads are held by friction in contact with the terminals.

3. A method of aligning and mounting a plurality of electrical leads to a plurality of corresponding spaced terminals, comprising:
    urging the leads into guide grooves and retaining the leads within such guide grooves against a resilient lateral stress, such guide grooves having a desired spacing corresponding to the spacing of said terminals;
    forming a length of material across the leads and into spaces between adjacent leads to retain relative spacing of the leads as established by the leads having been urged into said guide grooves;
    mounting the spaced leads in contact with corresponding ones of the spaced terminals under a resilient urging force between the leads and the corresponding terminals, such urging force establishing a friction force between the leads and the terminals; and
    releasing the mounted leads from the retaining force of the formed material prior to permanently bonding the leads to the terminals and after establishing the friction force to temporarily hold the leads in alignment with the corresponding terminals against any pre-existing lateral stress in the leads.

4. A method of aligning and mounting a plurality of electrical leads according to claim 3, wherein forming a length of material comprises forming a length of solder across the leads and into spaces between the leads to temporarily retain the relative spacing of the leads.

5. A method of aligning and mounting a plurality of electrical leads according to claim 3, wherein the leads are connector leads extending from a circuit pack connector and the terminals are conductive contact pads on a printed wiring board, and mounting the spaced leads into contact with corresponding ones of the contact pads comprises:
    aligning the spaced leads with and contacting such leads to corresponding ones of the contact pads on the printed wiring board;
    urging the circuit pack connector against a resiliently resisting force of the leads into a mounting position with respect to the printed wiring board to resiliently stress the leads in a direction perpendicular to the plane of the printed wiring board, whereby the leads become resiliently urged into contact with the contact pads on the printed wiring board.

6. A method of aligning and mounting a plurality of electrical leads according to claim 5, wherein the contact pads on the printed wiring board are solder lands and forming a length of material comprises forming a length of solder across the leads and into spaces between the leads to temporarily retain the relative spacing of the leads.

7. A method of aligning and mounting a plurality of electrical leads according to claim 6, wherein forming a length of solder comprises:

placing a length of solder into a cross groove intersecting each of the guide grooves retaining the leads in spaced relation; and urging the length of solder around each of the lead, into contact with two opposite sides of the leads and to a level below the level of the leads in the spaces between ajacent leads to form an inverted channel below each lead in the length of solder temporarily spacing the leads, such inverted channels guiding the leads onto such solder lands during said step of aligning the leads.

* * * * *